(12) United States Patent
Shibuya

(10) Patent No.: US 6,243,850 B1
(45) Date of Patent: Jun. 5, 2001

(54) ALLOCATION APPARATUS AND METHOD FOR DETERMINING CELL ALLOCATION OF SEMICONDUCTOR CIRCUIT

(75) Inventor: Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/064,150

(22) Filed: Apr. 22, 1998

(30) Foreign Application Priority Data

Nov. 7, 1997 (JP) .................................................. 9-305170

(51) Int. Cl.$^7$ ........................................................ G06F 17/50
(52) U.S. Cl. .......................................................... 716/8; 716/11
(58) Field of Search ................................ 716/8, 9, 10, 11

(56) References Cited

U.S. PATENT DOCUMENTS

| | | | |
|---|---|---|---|
| 4,908,772 | * 3/1990 | Chi | 716/10 |
| 6,035,111 | * 3/2000 | Suzuki et al. | 716/11 |
| 6,038,382 | * 3/2000 | Kanazawa | 716/10 |

FOREIGN PATENT DOCUMENTS 7-321208  12/1995  (JP) ............................... H01L/21/82

OTHER PUBLICATIONS

R. Tsay, et al., "Proud: A Sea-of-Gates Placement Algorithm", *IEEE Design& Test of Computers*, pp. 44–56, (1988).

* cited by examiner

*Primary Examiner*—Trong Phan

(57) ABSTRACT

Not only a cell included in a semiconductor circuit but also a wiring net between cells is regarded as one node and thereby a network model is created. Then, the simultaneous equations of a resistive network are created based on the network model and the optimum position of each node is calculated by solving the equations using a successive over-relaxation method.

16 Claims, 21 Drawing Sheets

CELL NODE

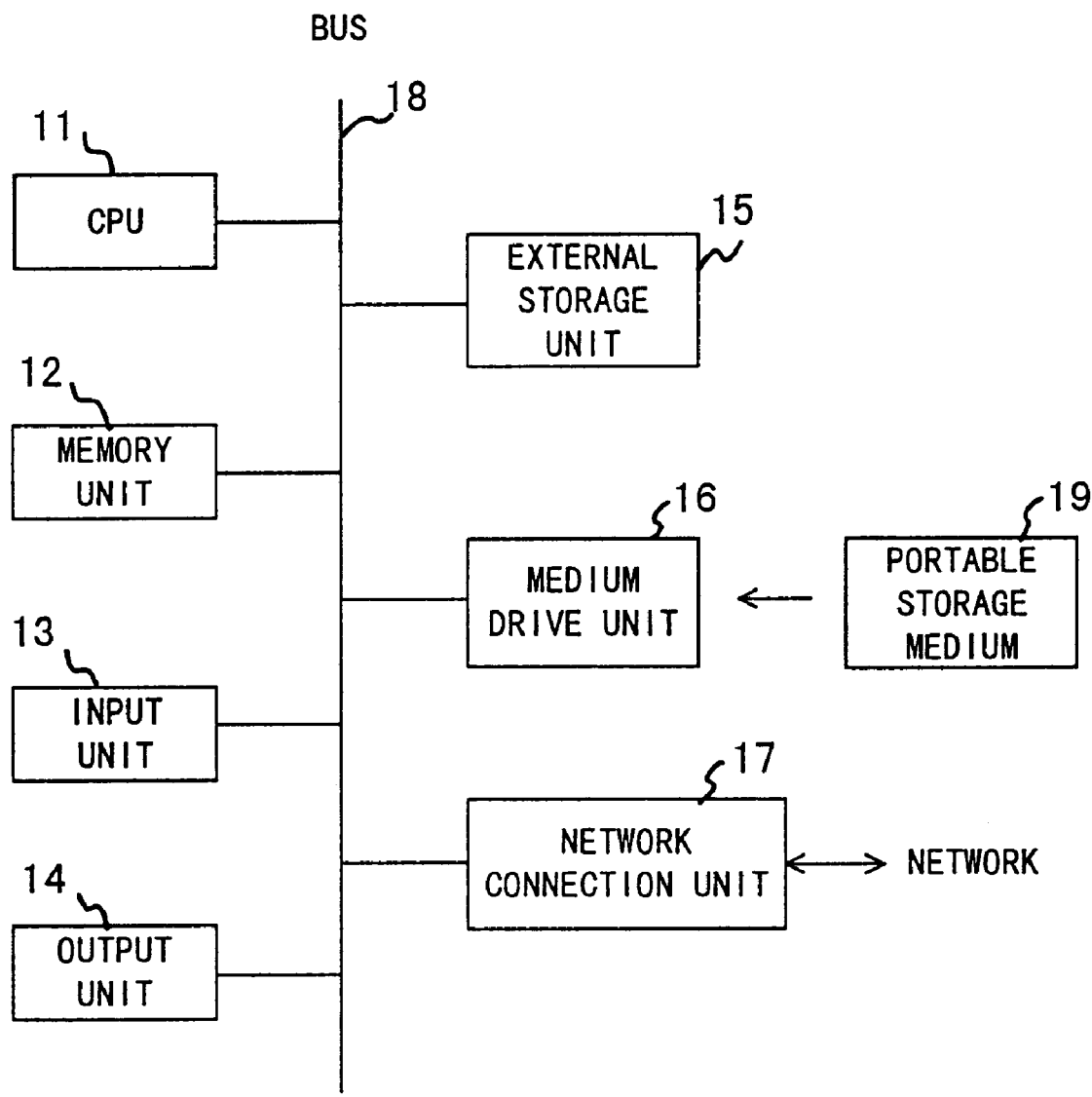
F I G. 4

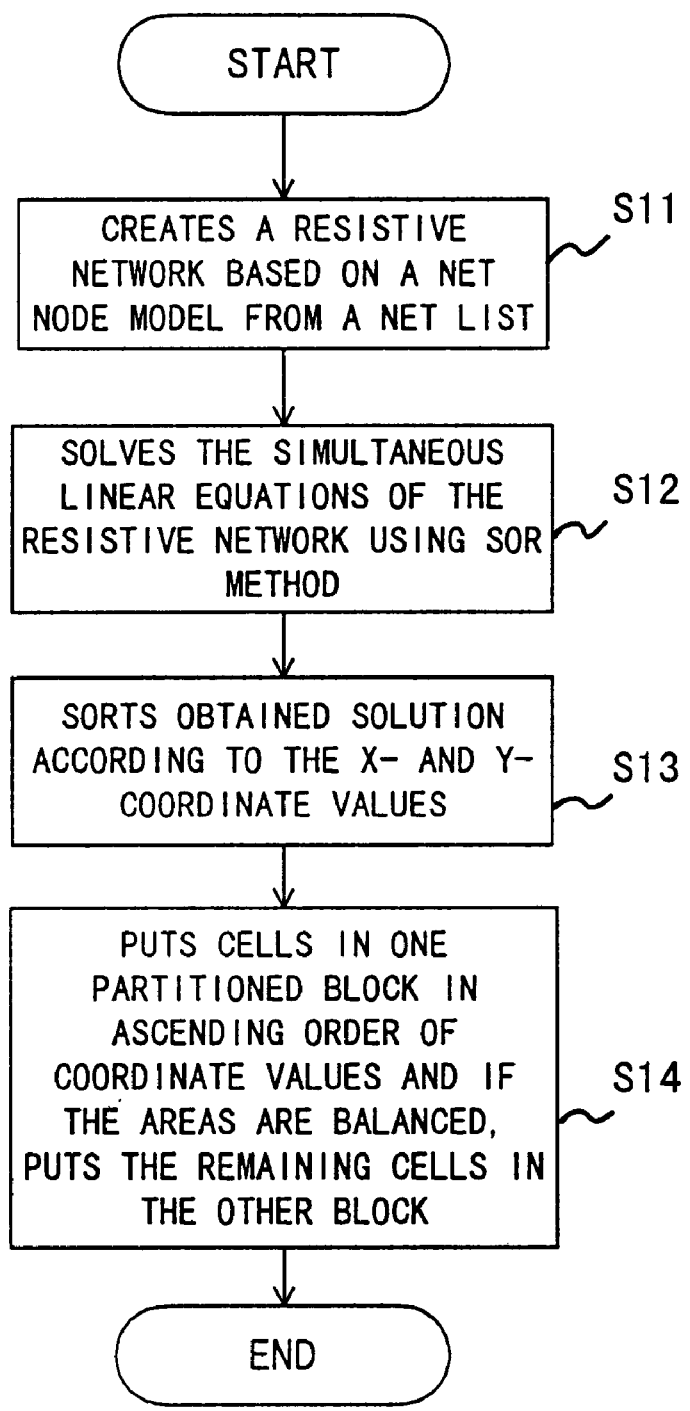
F I G. 6

ALLOCATION APPARATUS AND METHOD FOR DETERMINING CELL ALLOCATION OF SEMICONDUCTOR CIRCUIT

BACKGROUND OF THE INVENTION

1. Field of the Invention

The present invention relates to an allocation apparatus and method for determining cell allocation in the automatic layout, etc. of semiconductor circuits.

2. Description of the Related Art

As the technology for semiconductor integrated circuits has recently improved, the improvement in integration of very large-scale integration (VLSI) chips and the increase in the scale of circuits has become remarkable. Since both the improvement in integration and the increase in circuit scale are accompanied by an increase in the number of cells included in VLSI chips, it is getting harder and harder to get an optimum solution to a cell allocation issue.

In the layout design of LSIs, the process of partitioning an allocation area on a chip is repeated utilizing a computer system, and thereby the default allocation of each cell is determined. The allocated cells correspond to module components, etc., the shapes of the cells are usually rectangular, and the cells have a certain area. As one conventional partitioning method there is a method of using a resistive network model based on the analogy of electric circuits (R-S. Tsay, E. Kuh, and C-P. Hsu, "A Sea-of-Gates Placement Algorithm", IEEE Design & Test of Computers, December 1988, pp.44–56).

FIG. 1A is a flowchart showing a block Gauss-Seidel method being one partitioning method using the resistive network model. When the process is started, first the system constructs a resistive network based on a net list for indicating the wiring of a given circuit (step S1).

Here, a resistive network means a graph in which cells are represented by nodes and a plurality of cells belonging to the same net are connected by means of edges. In this case, for the model indicating the connection of cells, a complete connection model as shown in FIG. 1B is used. In the complete connection model each node on one net is connected with all other nodes of the net.

Then, the simultaneous linear equations of the constructed resistive network are created, and are solved using a successive over-relaxation (SOR) method (step S2). The SOR method corresponds to a generalized Gauss-Seidel method, which is an iterative method for solving simultaneous linear equations.

It is generally known that the solution of the simultaneous linear equations of a resistive network gives the cell positions where the following objective function of a cell allocation issue becomes a minimum.

$$L(x, y) = 1/2 \sum_{i,j=1}^{n} c_{ij}[(x_i - x_j)^2 + (y_i - y_j)^2] \quad (1)$$
$$= x^t B x + y^t B y$$

where n, $(x_i, y_i)$, and x and y represents the total number of cells, the coordinates of the i-th cell (i=1, 2, 3, . . . , n), and the n-dimensional vector with the x-coordinate and y-coordinate of n cells as the elements, respectively.

$c_{ij}$ is a connection coefficient between the i-th cell and j-th cell, where $c_{ii}=0$ and $c_{ij}=c_{ji}$. The matrix B of n×n is expressed using a symmetrical matrix C with a $c_{ij}$ as the element as follows:

$$B = D - C \quad (2)$$

Provided that a matrix D is a diagonal matrix with the following diagonal element.

$$d_{ii} = \sum_{j=1}^{n} c_{ii} \quad (3)$$

Therefore, the objective function L (x, y) of the equation (1) corresponds to the sum of squares of the wire lengths between the cells, and it is considered that the cell position (x, y) where the value of L (x, y) becomes a minimum, gives the optimum cell allocation. The solution of the simultaneous linear equations of a resistive network corresponds to a cell position such as this.

Then, the obtained cell position $(x_i, y_i)$ is sorted according to the respective values of the x-coordinate and y-coordinate (step S3). Then, cells are put in one partitioned block of the allocated area in ascending order of the respective coordinate values, and when the cell areas are balanced, the remaining cells are put in the other partitioned block (step S4).

The point where the cell areas are balanced means, for example, the point where the total sum of cell areas contained in a block becomes about half of the sum of all cell areas. In this way, n cells are so divided into two blocks that both areas are balanced, and then the process is terminated. By repeating the division of both the x-direction and y-direction in this way, the size of the blocks is gradually reduced, and finally each block can be made to contain only one cell.

However, the above-mentioned conventional partitioning method has the following problems.

Since a complete connection model as shown in FIG. 1B is used when converting a net list to a resistive network, the value of the objective function does not become small unless all distances between the cells connected to a certain net are about the same. Accordingly, as a result, cells are uniformly distributed in two-dimensions, and the result does not necessarily match with an actual wiring pattern.

In this partitioning method, although the solution is sorted according to the value of a cell position coordinate when applying a block Gauss-Seidel method, the number of cuts on the boundary of blocks is not taken into consideration. The number of cuts means the number of wires transversing a cut line (border line), and in the layout design of semiconductor integrated circuits, it is desirable to minimize this number.

SUMMARY OF THE INVENTION

It is an object of the present invention to provide an allocation apparatus and method for optimizing the cell allocation in the layout design of semiconductor integrated circuits using a circuit model closer to actual wiring.

The allocation apparatus of the present invention comprises a creation unit, a storage unit, a calculation unit and an output unit, and determines the cell allocation of a given circuit.

The creation unit creates both cell nodes corresponding to a plurality of cells and a net node corresponding to a net between cells from a net list of the circuit. The storage unit stores the parameters for simultaneous equations on the positions of both the cell nodes and the net node. The calculation unit solves the simultaneous equations using the stored parameters. The output unit outputs the solution.

By adopting an allocation apparatus such as this, since a net node is inserted among cell nodes, there is no need to directly connect the cell nodes. Accordingly, the connection relationship among cell nodes becomes weaker than with a conventional node model, and the flexibility of cell allocation is improved compared with the conventional model.

For the simultaneous equations for determining cell allocation, for example, the above-mentioned simultaneous linear equations of a resistive network are used, and by solving the equations using the SOR method, the positions of both the cell nodes and net node are optimized. The partitioning of cells, grouping of flip-flops, partitioning of cells in consideration of an existing wiring pattern, determination of external terminal positions in a floor plan, etc., can also be implemented by using this result.

BRIEF DESCRIPTION OF THE DRAWINGS

FIG. 4 shows the configuration of an information processing device.

FIG. 6 is a flowchart showing the first partitioning process.

DESCRIPTION OF THE PREFERRED EMBODIMENTS

The embodiments of this invention are described in detail below with reference to the drawings.

Figure 2:
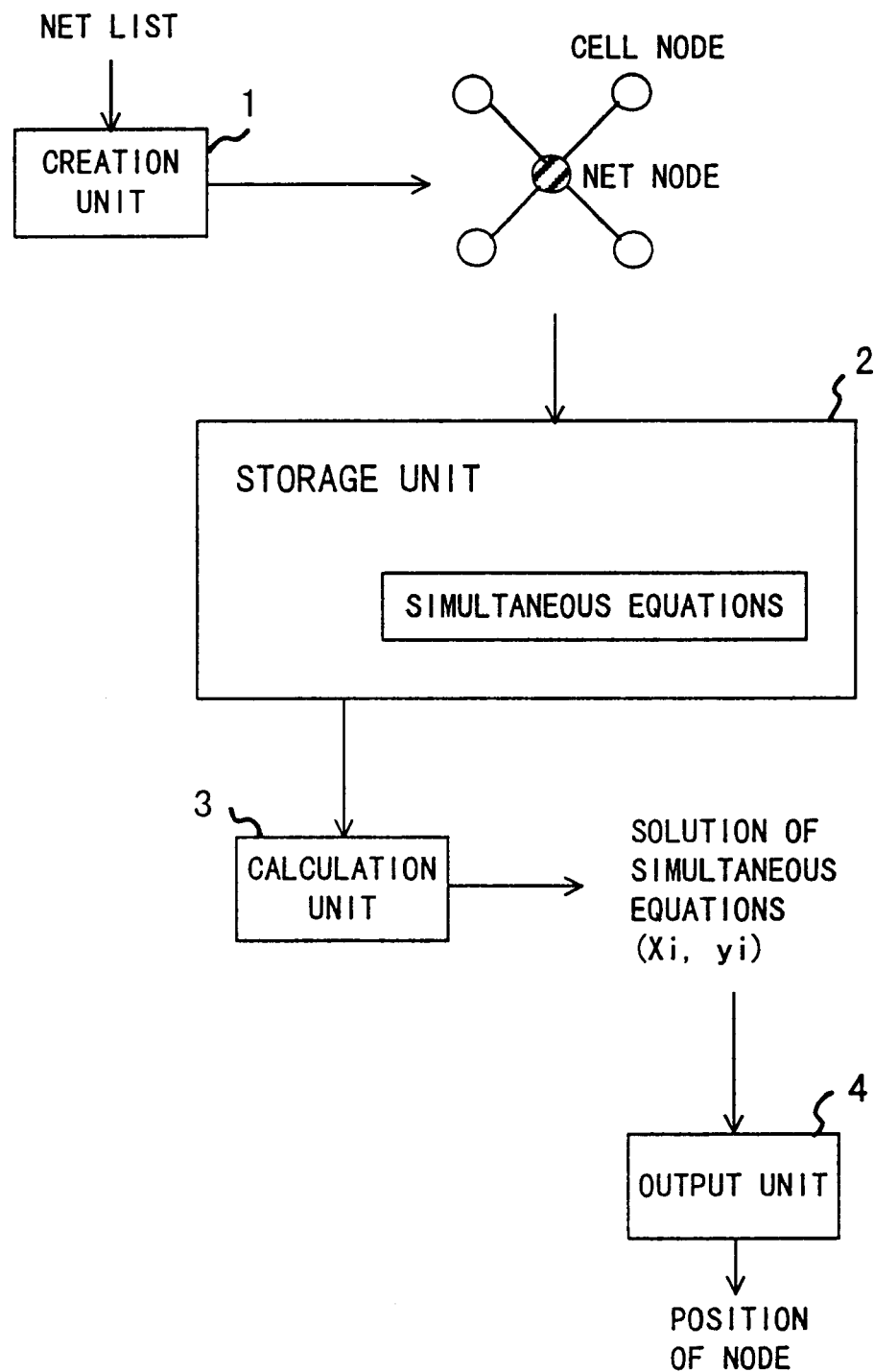
FIG. 2 shows the principle of the allocation apparatus the present invention.

FIG. 2 shows the principle of the allocation apparatus of the present invention. The allocation apparatus comprises a creation unit 1, a storage unit 2, a calculation unit 3 and an output unit 4, and determines the cell allocation of a given circuit.

The creation unit 1 creates both cell nodes corresponding to a plurality of cells and a net node corresponding to a net among the cells.

The storage unit 2 stores parameters for simultaneous equations on the position of both the cell nodes and the net node.

The calculation unit 3 solves the simultaneous equations using the stored parameters.

The output unit 4 outputs the solution.

Here, a circuit means an arbitrary electronic/electric circuit including a semiconductor integrated circuit, and a cell corresponds to a component of the circuit. The net list of a circuit means a list of nets representing the wiring among the cells.

The creation unit 1 creates one cell node for each of the plurality of cells included in the net list of a given circuit, and creates one net node for a net for connecting several cells and external terminals. Then, simultaneous equations having the coordinate values of these node positions as variables are created, and the coefficient matrix, the vector of the constant terms, etc. are stored as parameters.

The calculation unit 3 executes a calculation process of solving the simultaneous equations, and the output unit 4 outputs the obtained solution as the allocation positions of each of the nodes. The cell allocation is determined based on the position corresponding to the cell node extracted from the obtained solution.

By adopting an allocation apparatus such as this, since a net node is inserted among cell nodes, there is no need to directly connect cell nodes. Accordingly, the connection relationship among cell nodes becomes weaker than with a conventional node model, and the flexibility of cell allocation is improved compared with the conventional model.

If a net node is regarded as a Steiner point in an actual wiring pattern, a circuit model using a net node can be considered closer to an actual wiring pattern model. Accordingly, the solution of cell allocation obtained using a net node is often more desirable than a conventional solution.

For the simultaneous equations for determining cell allocation, for example, the above-mentioned simultaneous linear equations of a resistive network are used, and by solving the equations using the SOR method, the positions of both the cell nodes and the net node are optimized. The partitioning of cells, grouping of flip-flops, partitioning of cells in consideration of an existing wiring pattern, determination of external terminal positions in a floor plan, etc. can also be implemented by using this result.

For example, the creation unit 1 and calculation unit 3 shown in FIG. 2 correspond to the combination of a CPU (central processing unit) 11 and a memory unit 12, the storage unit 2 corresponds to a memory unit 12 or an external storage unit 15, and the output unit 4 corresponds to an output unit 14, respectively, described later with reference to FIG. 4.

In this embodiment, not only a cell being the target to be allocated, but also a net is regarded as one node in a partitioning method being one default allocation determining method of cells, and thereby a resistive network method is applied. Accordingly, cells are divided in the state where the position of each cell is optimized.

Figure 3A:
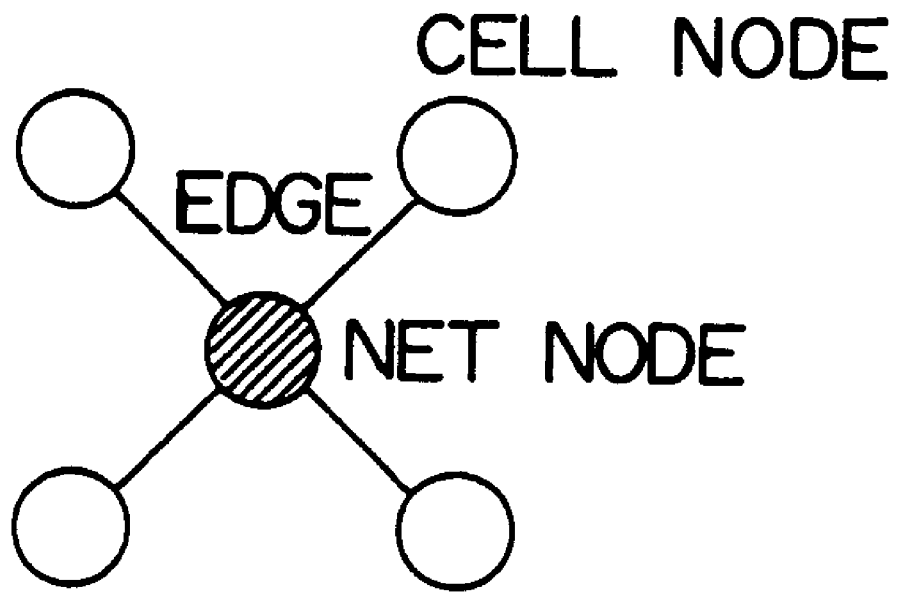
FIG. 3A shows a net node.

When modelling a net list in a resistive network method, one net node is created for one net as shown in FIG. 3A. Then, an edge is created between the net node and the cell node of each cell connected to the net.

In a net node model such as this, as long as the distance between the net node and each cell node is constant, there is no change in the cost due to the wiring length determined in equation (1). That is, since there is less restriction on the connection between nodes compared with a conventional complete connection model as shown in FIG. 1B, the flexibility of the solution has been increased.

Figure 3B:
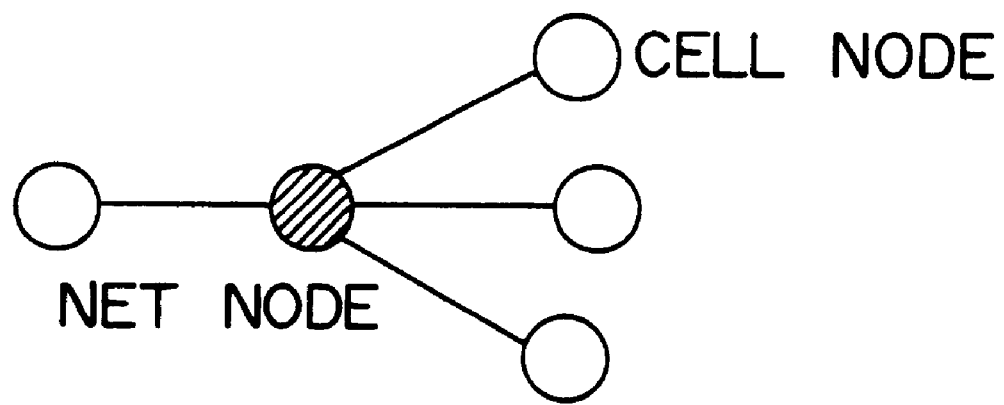
FIG. 3B shows the cell allocation in a net node model.

For example, in the case of FIG. 3A, each edge can be rotated around a net node without causing a cost increase, and such an allocation as shown in FIG. 3B can also be obtained. In the conventional model, since the cost is far higher than the allocation shown in FIG. 3A, there is only a very small possibility that such an allocation is included in the optimum solution.

Figure 1A:
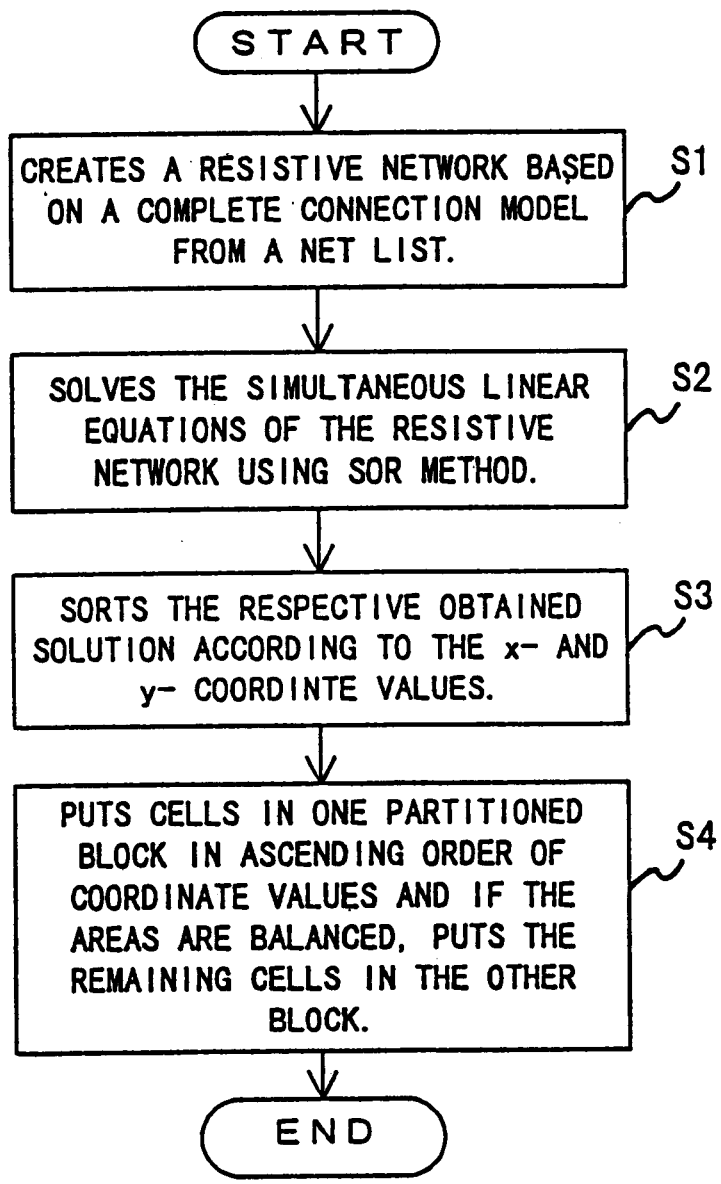
FIG. 1A is a flowchart showing a conventional partitioning method.
Figure 1B:
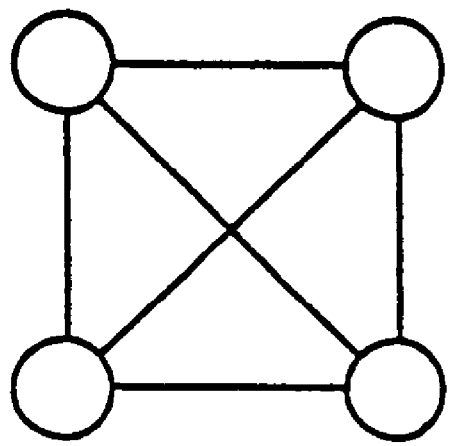
FIG. 1B shows a complete connection model.

When the complete connection model shown in FIG. 1B and the net node model shown in FIG. 3A are compared, in FIG. 3A the dimensions of the simultaneous equations of a corresponding resistive network increase. However, the number of edges between nodes is decreased, and the shape of a graph is simplified. For this reason, each equation becomes simple even if the dimension increases, and it is confirmed that a calculation volume is reduced in the case of using the SOR method, etc.

The allocation apparatus of this embodiment can be constructed, for example, using an information processing device (computer) as shown in FIG. 4. The information processing device shown in FIG. 4 comprises a CPU 11, a memory unit 12, an input unit 13, an output unit 14, an external storage unit 15, an medium drive unit 16 and a network connection unit 17, which are connected by means of a bus 18.

In the memory unit 12, programs and data to be used for the process are stored. For the memory unit 12, for example, a ROM (read only memory), RAM (random access memory), etc. are used. The CPU 11 executes processes necessary to allocate and partition cells by running a program using the memory unit 12.

For the input unit 13 there are, for example, a keyboard, pointing device, touch panel, etc., and the input unit 13 is used to input the instructions from users and information such as a net list, the designated positions of nodes, etc. For the output unit 14 there are, for example, a display, printer, etc., and the output unit 14 is used to output the result of processes, etc.

For the external storage unit 15 there are, for example, a magnetic disk device, optical disk device, magneto-optical disk device, etc., and the external storage unit 15 is used to store data such as a net list, net node model, the simultaneous equations of a resistive network, etc. This external storage unit 15 stores the above-mentioned programs and data, and can also load memory unit 12 with programs and data so that the programs and data can be used, if required.

The medium drive unit 16 drives a portable storage medium 19, and accesses the recorded contents. For the portable storage medium 19, an arbitrary computer-readable storage medium such as a memory card, floppy disk, CD-ROM (compact disk read only memory), optical disk, magneto-optical disk, etc. are used. This portable storage medium 19 stores the above-mentioned programs and data, and can also load the memory unit 12 with programs and data so that the programs and data can be used, if required.

The network connection unit 17 communicates with outside devices via an arbitrary network (line) such as a LAN (local area network), etc., and performs data conversations accompanying communication. Using this, the above-mentioned programs and data can be received from outside devices, and be loaded to the memory unit 12 to be used, if required.

Figure 5:
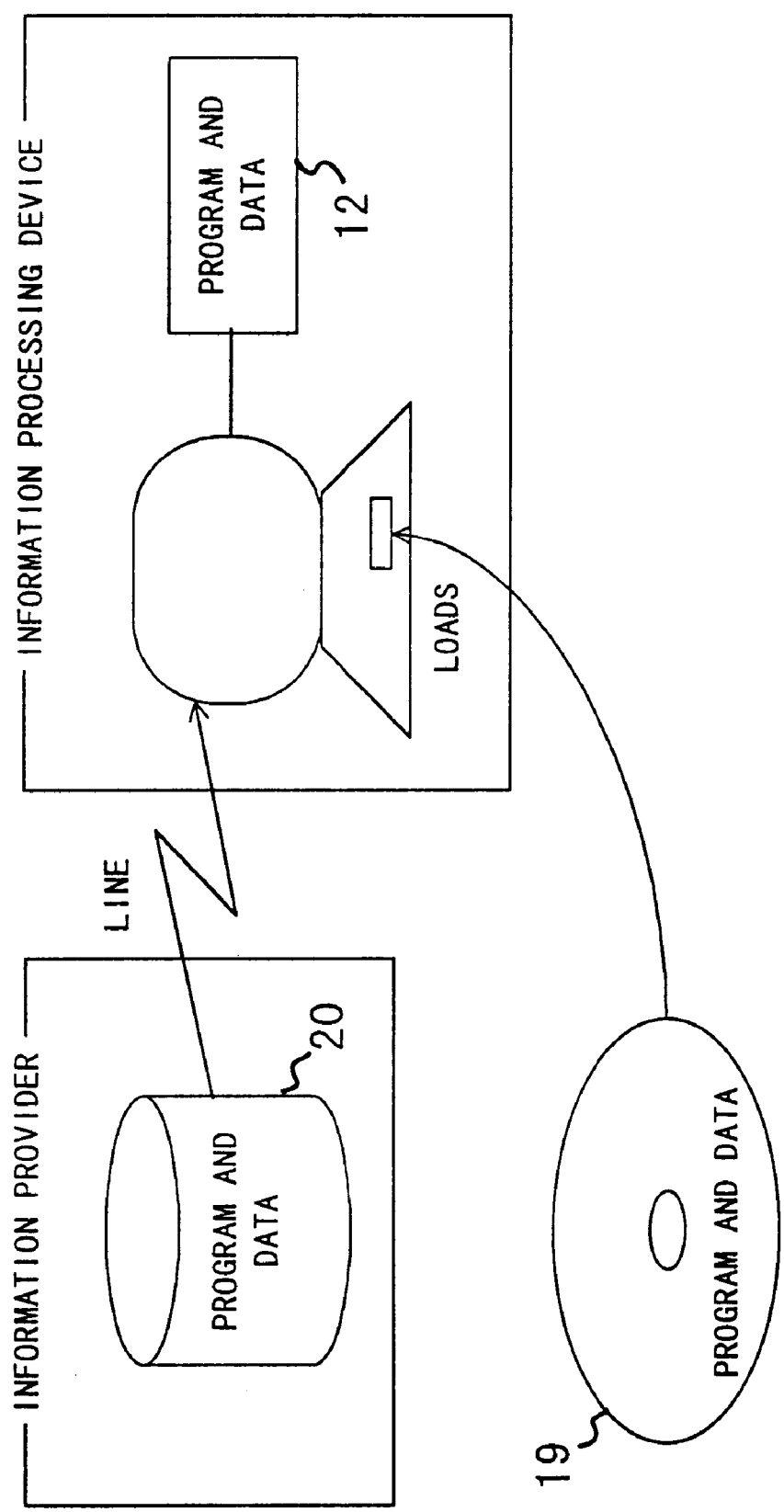
FIG. 5 shows storage media.

FIG. 5 shows computer-readable storage media for supplying programs and data to the information processing device shown in FIG. 4. The programs and data stored in the portable storage medium 19 and an outside database 20 are loaded to the memory unit 12. Then, the CPU 11 runs the programs using the data, and executes the necessary processes.

FIG. 6 is a flowchart showing the partitioning process executed by the allocation apparatus of this embodiment.

Here, a block Gauss-Seidel method is used. When the process is started, first the allocation apparatus constructs a resistive network using the net list of a given circuit based on the net node model (step S11).

Figure 7:
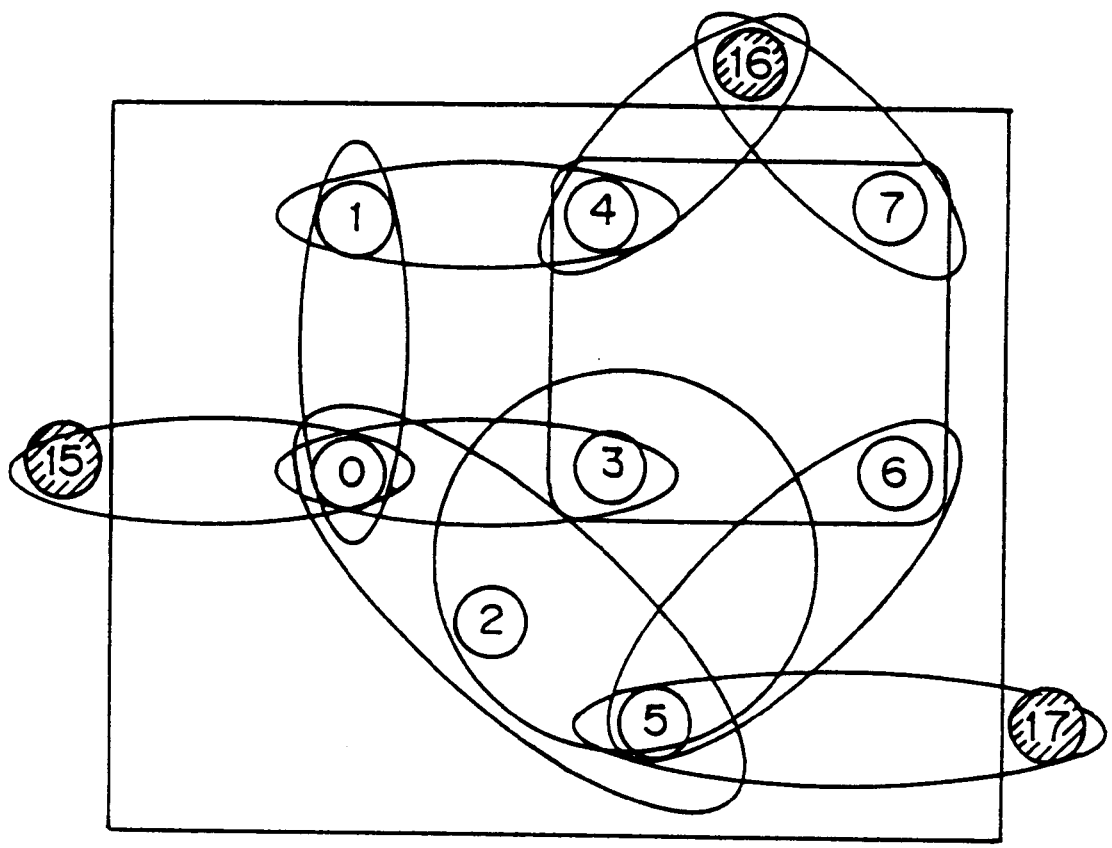
FIG. 7 shows nets in a circuit.

For example, it is assumed that a net list of a circuit containing eleven cells is given as shown in FIG. 7. Cells 15, 16 and 17 out of these cells are fixed cells corresponding to the external terminal points of the circuit, and cells 0 through 7 are free cells the positions of which are not fixed. Two or more cells enclosed by an ellipse are connected to the same net. From this circuit a net node model as shown in FIG. 8 is created.

Figure 8:
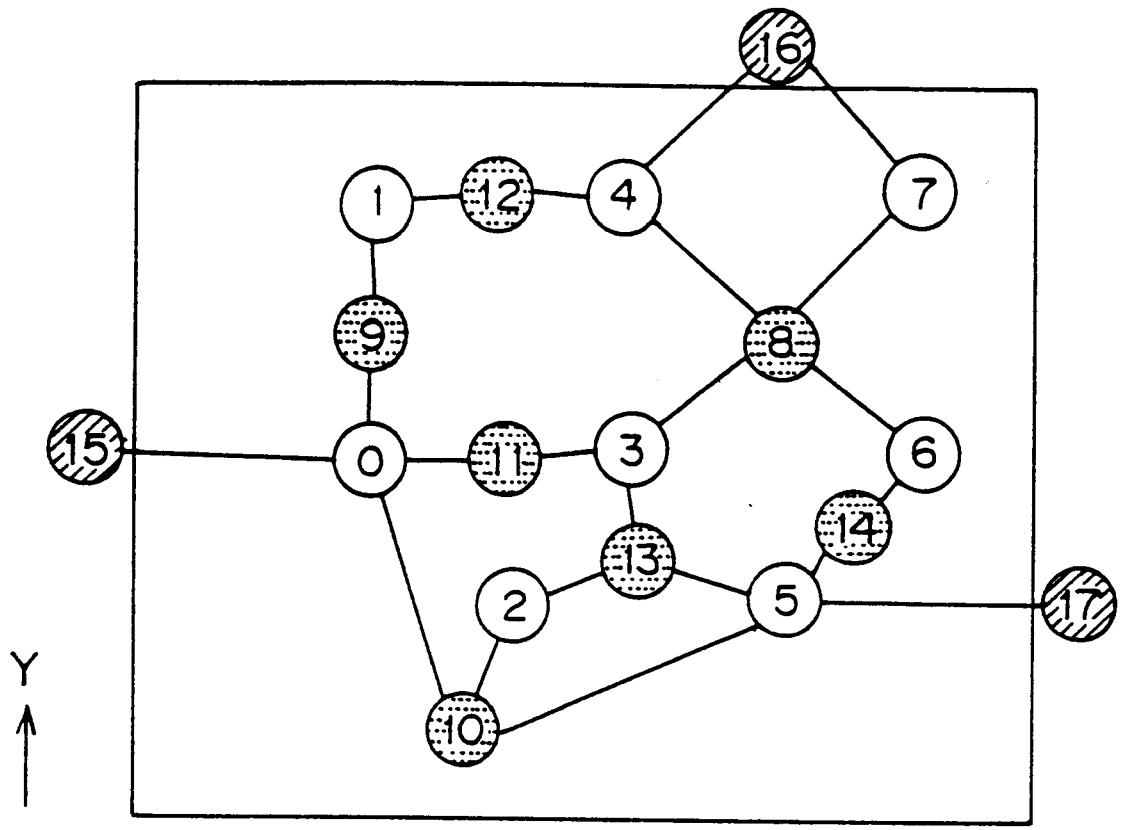
FIG. 8 shows the first net node model.

The number of each cell node in FIG. 8 corresponds to the number of each cell in FIG. 7. Here, a net node is further created in each net containing only free cells. For example, a net node 8 is created among cell nodes 3, 4, 6 and 7. Net nodes 9, 10 and 11 are also created between cell nodes 0 and 1, among cell nodes 0, 2 and 5, and between cell nodes 0 and 3, respectively.

Net nodes 12, 13 and 14 are also created between cell nodes 1 and 4, among cell nodes 2, 3 and 5, and between cell nodes 5 and 6, respectively. Since the fixed cells having their own predetermined positions play a role of a net node themselves, a new node is not created for a net including a fixed cell.

Figure 9:
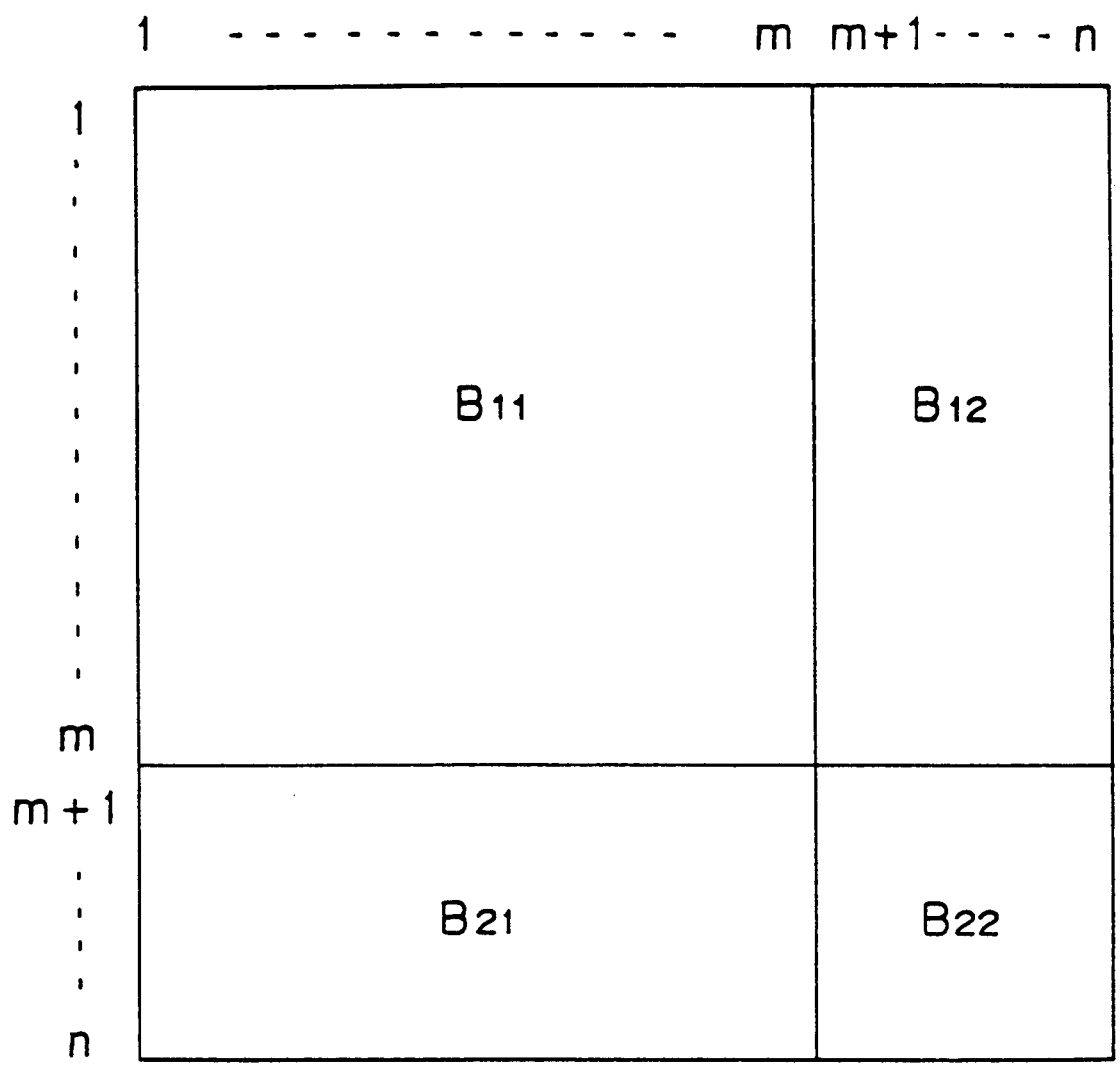
FIG. 9 shows the partial matrix of a matrix B.

Then, the simultaneous linear equations of the constructed resistive network are created, and the equations are solved using the SOR method (step S12). When out of n node positions $(x_i, y_i)$ the first m (i=1, 2, 3, . . . , m) and the remaining (n–m) (i=m+1, . . . , n) are unfixed and fixed, respectively, the number of equations can be reduced from n to m. Therefore, the simultaneous linear equations of the resistive network can be described as follows using the partial matrices $B_{11}$ and $B_{12}$ of the matrix B of the equation (1) and the partial vectors x1 and x2 of vector x.

$$B_{11}x1+B_{12}x2=0 \qquad (4)$$

where $B_{11}$ and $B_{12}$ are the partial matrix of m×m and the partial matrix of m×(n–m), respectively, as shown in FIG. 9. Other partial matrices $B_{21}$ and $B_{22}$ are not necessarily required to be created, and x1 and x2 are an m-dimensional partial vector with $x_1, \ldots, x_m$ as the elements and an (n–m) dimensional partial vector with $x_{m+1}, \ldots, x_n$ as the elements, respectively. Since each element of x2 is predetermined, it is convenient to transform the equation (4) to the following in order to calculate x1 from the equation (4).

$$B_{11}x1=-B_{12}x2 \qquad (5)$$

The equation (5) can be solved by way of the SOR method using a computer, and the optimum x-coordinate of m nodes can be obtained. The y-coordinate of these nodes can be obtained from similar simultaneous linear equations.

Then, out of the obtained node positions $(x_i, y_i)$ the node positions corresponding to cells are sorted according to the respective values of the x-coordinates and y-coordinates (step S13). Then, when cells are put in one partitioned block of the allocation area in ascending order of the respective coordinate values, and the cell areas are balanced, the remaining cells are put in the other partitioned block (step S14). Thus, all free cells are so divided into two blocks that their areas are uniformly balanced, and then the process is terminated.

The number of cuts can be reduced further by devising a method of partitioning cells located around the boundary of blocks when a block Gauss-Seidel method is used in this partitioning process.

Figure 10:
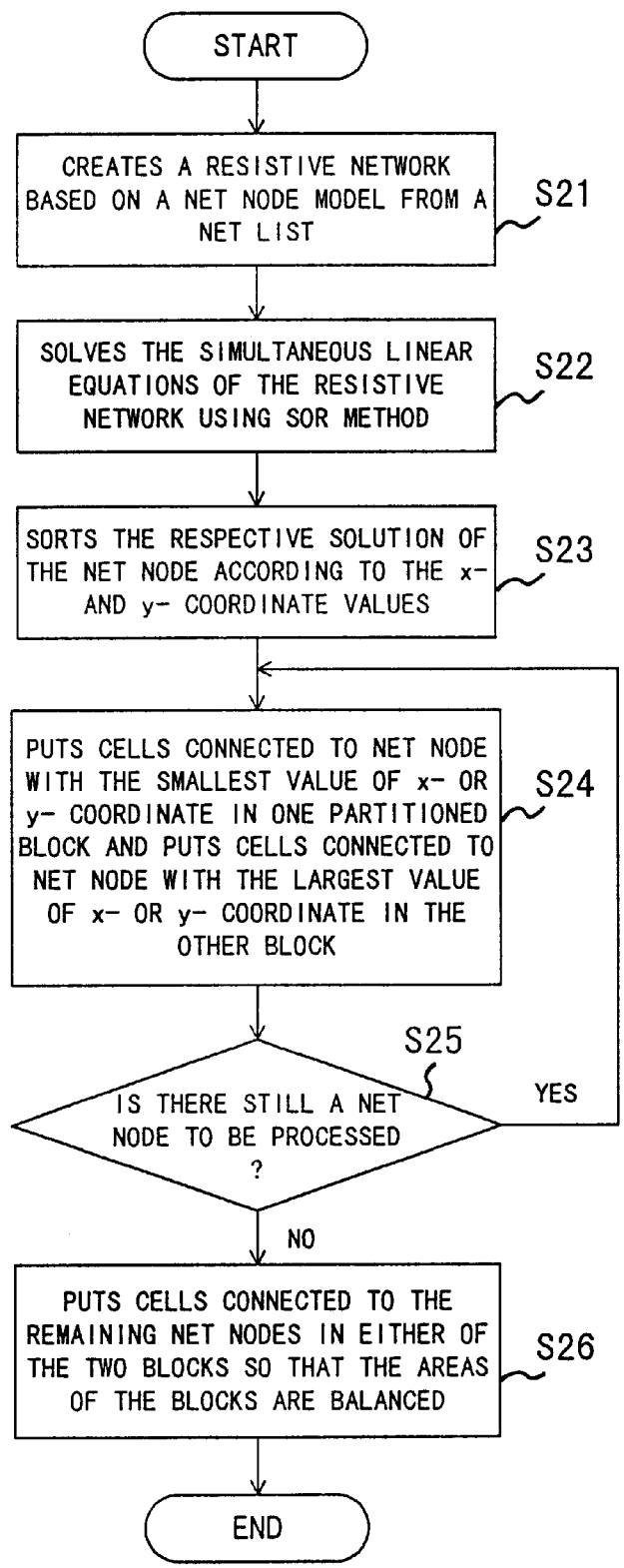
FIG. 10 is a flowchart showing the second partitioning process.

FIG. 10 is a flowchart showing the partitioning process in this case. When the process is started, first the allocation apparatus constructs a resistive network using the net list of a given circuit based on a net node model (step S21). Then, the simultaneous linear equations of the constructed resistive network are created, and the equations are solved by way of the SOR method (step S22). The processes up to this point are the same as in the partitioning process shown in FIG. 6.

Then, out of the obtained node positions ($x_i$, $y_i$) the net node positions are sorted according to the respective values of the x-coordinates and y-coordinates (step S23). Then, net nodes with the smallest and largest coordinates are selected (step S24).

When cells are divided into two blocks vertically, all cells connected to the net node with the smallest x-coordinate and all cells connected to the net node with the largest x-coordinate are allocated to the left and right blocks, respectively. When cells are divided into two blocks horizontally, all cells connected to the net node with the smallest y-coordinate and all cells connected to the net node with the largest y-coordinate are allocated to the lower and upper blocks, respectively.

In this case, if one or more cells connected to a net node are already included in the opposite block, the process of the net is reserved. If the total sum of areas of cells contained in the respective block exceeds the block capacity, the process is terminated. The block capacity is set as the limit value of an area in advance.

Then, it is judged whether or not there is still a net node to be processed (step S25). In this case, if there is still the net node of a net other than the nets of which the processings are reserved, the processes of steps S24 and after are repeated.

When there is no net node to be processed, then out of cells connected to the nets of which the processing is reserved, cells not yet assigned to either of the blocks are assigned to one of the blocks so that the cell areas of the two blocks may be balanced (step S26).

In this case, the net node whose degree indicating the number of edges is the greatest, is selected. Then, if the areas of the two blocks are balanced when the net node is put in the block nearest the net node position, cells connected to the net node are put in the block. If the areas of the two blocks are not balanced, cells connected to the net node are put in the opposite block. When by repeating this process, all cells are assigned to a block, the process is terminated.

Next, the contents of the process shown in FIG. 10 are described in detail below using the net node model shown in FIG. 8. It is assumed that the allocation area enclosed by a solid line in FIG. 8 is divided vertically, and the x-axis and y-axis are set horizontally and vertically, respectively. Then, the positions of the fixed cells (x, y) shall be as follows:
Node 15: (0.0, 16.0),
Node 16: (12.0, 20.0),
Node 17: (20.0, 3.0).

In this case, in step S22 a 15-dimensional vector with the x-coordinates of nodes 0 through 14 as the elements and a 3-dimensional vector with the x-coordinates of nodes 15 through 17 as the elements are designated as x1 and x2, respectively, and the simultaneous linear equations of the equation (5) are created. Then, the coefficient matrix $B_{11}$ in the left side and the vector $(-B_{12}x2)$ of the constant term of the right side are stored as parameters for describing the simultaneous linear equations.

In this case, by appropriately determining a connection coefficient $c_{ij}$ among nodes, the values of the element [i, j] (i, j=0, 1, 2, . . . , 14) of matrix $B_{11}$ with 15 rows and 15 columns are as follows. The values of the other elements of the matrix $B_{11}$ are all 0.

[0, 0]=2.0,
[0, 9]=−0.5,
[0, 10]=−0.5,
[0, 11]=−0.5,
[1, 1]=1.0,
[1, 9]=−0.5,
[1, 12]=−0.5,
[2, 2]=1.0,
[2, 10]=−0.5,
[2, 13]=−0.5,
[3, 3]=1.5,
[3, 8]=−0.5,
[3, 11]=−0.5,
[3, 13]=−0.5,
[4, 4]=1.5,
[4, 8]=−0.5,
[4, 12]=−0.5,
[5, 5]=2.0,
[5, 10]=−0.5
[5, 13]=−0.5,
[5, 14]=−0.5,
[6, 6]=1.0,
[6, 8]=−0.5,
[6, 14]=−0.5,
[7, 7]=1.0,
[7, 8]=−0.5,
[8, 3]=−0.5,
[8, 4]=−0.5,
[8, 6]=−0.5,
[8, 7]=−0.5,
[9, 0]=−0.5,
[9, 1]=−0.5,
[9, 9]=1.0,
[10, 0]=−0.5,
[10, 2]=−0.5,
[10, 5]=−0.5,
[10, 10]=1.5,
[11, 0]=−0.5,
[11, 3]=−0.5,
[11, 11]=1.0,
[12, 1]=−0.5,
[12, 4]=−0.5,
[12, 12]=1.0,
[13, 2]=−0.5,
[13, 3]=−0.5,
[13, 5]=−0.5,
[13, 13]=1.5,
[14, 5]=−0.5,
[14, 6]=−0.5,
[14, 14]=1.0.

The values of the element [i, j] (i=0, 1, 2, . . . , 14; j=15, 16, 17) of matrix $B_{12}$ with 15 rows and 3 columns are as follows. The values of the other elements of matrix $B_{12}$ are all 0.

[0, 15]=0.5,
[4, 16]=0.5,
[5, 17]=0.5,
[7, 16]=0.5.

Then, if the created simultaneous linear equations are solved, the following coordinates of these nodes are obtained.
Node 0: (6.9, 14.3),
Node 1: (9.1, 15.9),
Node 2: (11.5, 11.9),
Node 3: (10.9, 13.9),
Node 4: (11.3, 17.5),
Node 5: (14.0, 9.6), Node 6: (12.4, 13.8),
Node 7: (11.8, 17.9),
Node 8: (11.6, 15.8),
Node 9: (8.0, 15.1),
Node 10: (10.8, 11.9),
Node 11: (8.9, 14.1),
Node 12: (10.2, 16.7),
Node 13: (12.1, 11.8),
Node 14: (13.3, 11.7).

Figure 11:
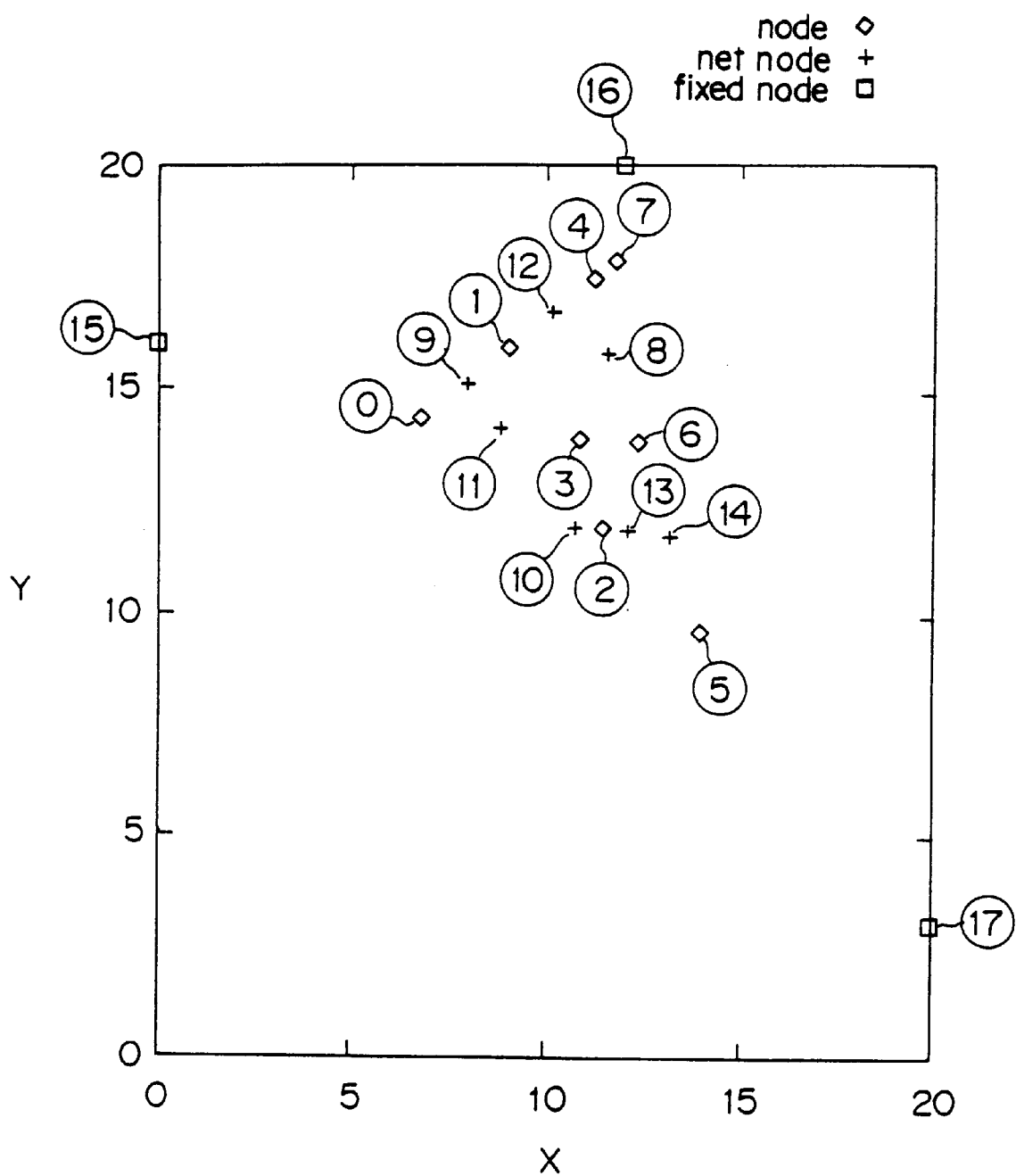
FIG. 11 shows the result of the first plotting.

If these node positions are plotted on an x-y coordinate plane, the result as shown in FIG. 11 can be obtained. Then, in step S23, since the allocation area is divided vertically, net nodes and the nodes of fixed cells are sorted in ascending order of x-coordinate values. In this case, both the nodes of fixed cells and the net nodes are handled in the same way. As a result, nodes 15, 9, 11, 12, 10, 8, 16, 13, 14 and 17 are arranged in that order.

Figure 12:
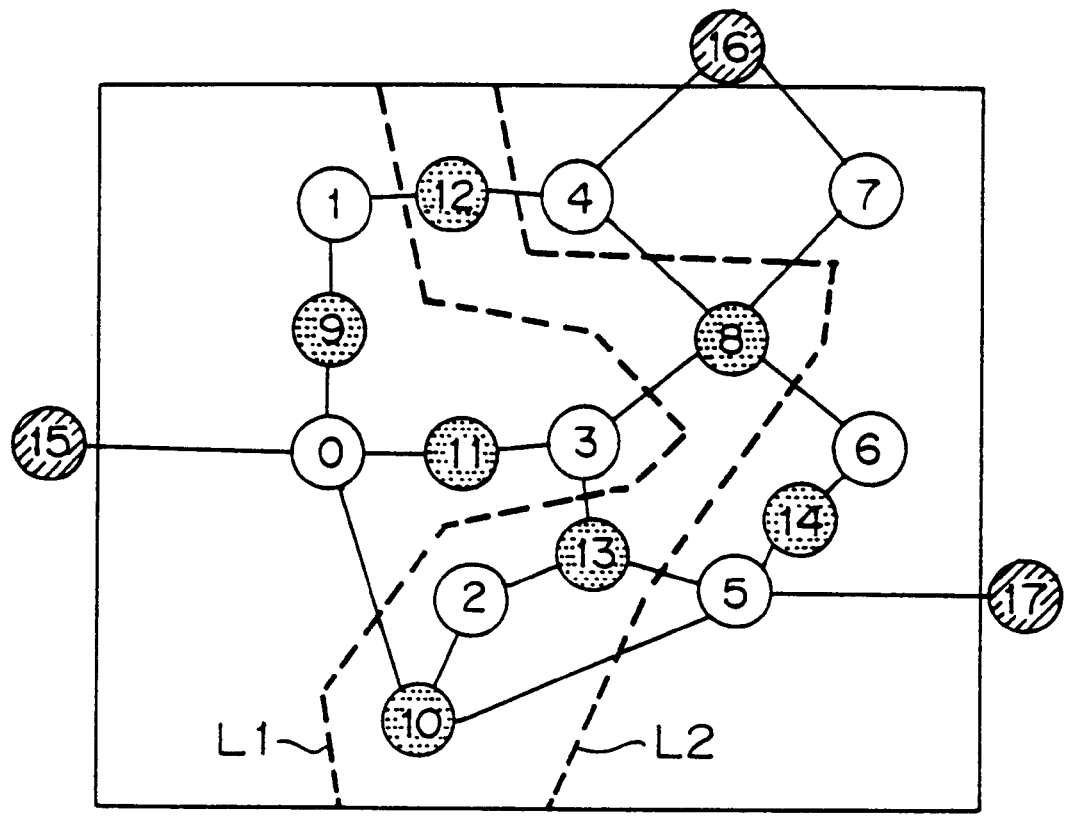
FIG. 12 shows the process of partitioning.

Then, in steps S24 and S25 cells connected to each net node are allocated to the right and left blocks. In this case, as shown in FIG. 12, all cells connected to the nets of nodes 15, 9, 11, 14, 16 and 17 can be consistently divided vertically.

In this case, cell nodes 0, 1 and 3 connected to nodes 15, 9 and 11 located to the left of a broken line L1 are allocated to the left block, and cell nodes 4, 5, 6 and 7 connected to nodes 14, 16 and 17 located to the right of a broken line L2 are allocated to the right block, respectively.

As a result, the allocation of all cell nodes connected to nodes 8 and 12 located between the broken lines L1 and L2 is already secured. Out of cell nodes connected to net nodes located between the broken lines L1 and L2, only node 2 is not allocated to either of the blocks.

Since the net nodes connected to node 2 are nodes 10 and 13, and other cell nodes connected to these net nodes are already distributed to both of the left and right blocks, the processing of node 2 is reserved.

Then, in step S26 the block to which the remaining cell node 2 belongs, is determined. In FIG. 12 the number of cells contained in the left block and right block are 3 and 4, respectively. If the area size of every cell is assumed to be almost the same, node 2 is put in the left block for reasons of balancing the areas.

In this way, by sorting the solution of the simultaneous linear equations according to the coordinates of the net nodes and distributing cells in units of nets, there is a strong probability that cells belonging to the same net are distributed to the same block. Accordingly, the number of nets stretched over two blocks can be reduced, and a more suitable number of cuts can be obtained compared with the case where the solution is sorted according to the coordinate of a cell node.

When the allocation area is divided into two blocks horizontally, both net nodes and the nodes of fixed cells can be processed in the same way by sorting these cells in ascending order of y-coordinate values. In this invention, by regarding not only cells but also nets as nodes and optimizing the allocation using a resistive network method, the grouping of flip-flops (FF), partitioning cells in consideration of an existing wiring pattern, determination of external terminal positions in a floor plan, etc. can also be implemented. Thus, these embodiments are further described below.

By applying a net node model to a clock-driven design method (CDDM), a plurality of FFs located near a clock pin can be grouped and allocated to the same block. A CDDM is a designing method of arranging clock skew (delay time) for a plurality of target cells, as described in "Method and Apparatus for Allocating and Wiring Semiconductor Integrated circuits" (Japan Laid-open Patent Publication No.H7-321208).

In this case, a net node is created corresponding to a local clock net for supplying a target cell containing one or more FFs with a clock signal, and the clock pin position of the local clock driver is given to the net node. Then, the processes of steps S21 and S22 shown in FIG. 10 are executed, and the position of the cell is determined. In this case, by putting target cells allocated in the neighborhood in the same group, the grouping of FFs can be implemented.

Figure 13:
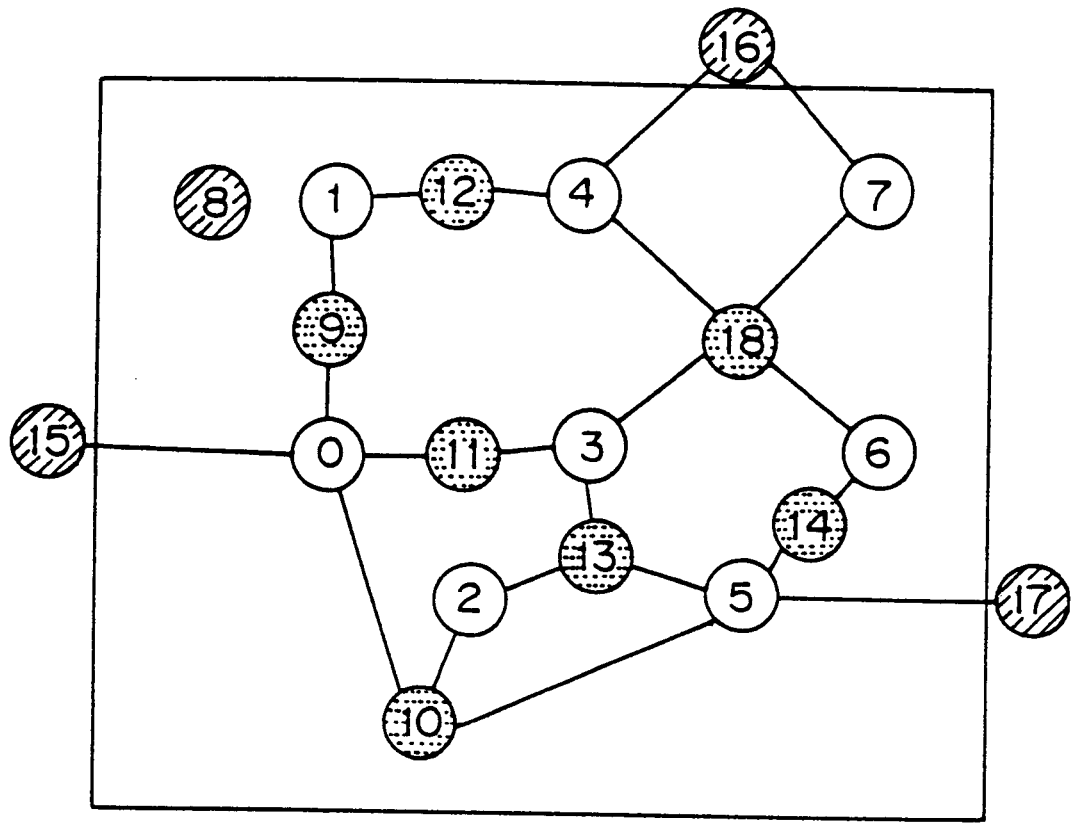
FIG. 13 shows the second net node model.

For example, if a net node 8 corresponds to a local clock net, cell nodes 3, 4, 6 and 7 connected to this net node are regarded as target cells, and the net node 8 is fixed at a clock pin position (15, 16). Then, the number of the node 8 is replaced with 18 for consideration of convenience in preparing a matrix, and a net node model as shown in FIG. 13 is created.

In this case, the positions (x, y) of nodes 15, 16, 17 and 18 are set as follows:
Node 15: (0.0, 16.0),
Node 16: (12,.0, 20.0),
Node 17: (20.0, 3.0),
Node 18: (15.0, 16.0).

In step S22, the simultaneous linear equations of the equation (5) in the case that a 15-dimensional vector with the x-coordinates of nodes 0 through 14 as the elements and a 4-dimensional vector with the x-coordinates of nodes 15 through 18 as the elements, are assumed to be x1 and x2, respectively, are obtained.

In this case, if the connection coefficient $c_{ij}$ between the nodes is appropriately determined, the values of the elements [i, j](i, j=0, 1, 2, . . . , 14) of the matrix $B_{11}$ with 15 rows and 15 columns are as follows. The values of the other elements of the matrix $B_{11}$ are all 0.

[0, 0]=2.0,
[0, 9]=−0.5,
[0, 10]=−0.5,
[0, 11]=−0.5,
[1, 1]=1.0,
[1, 9]=−0.5,
[1, 12]=−0.5,
[2, 2]=1.0,
[2, 10]=−0.5,
[2, 13]=−0.5,
[3, 3]=1.5,
[3, 11]=−0.5,
[3, 13]=−0.5,
[4, 4]=1.5,
[4, 12]=−0.5,
[5, 5]=2.0,
[5, 10]=−0.5,
[5, 13]=−0.5,
[5, 14]=−0.5,
[6, 6]=1.0,
[6, 14]=−0.5,
[7, 7]=1.0,
[8, 8]=0.0,
[9, 9]=1.0,
[9, 0]=−0.5,
[9, 1]−0.5,
[10, 0]=0.5,
[10, 2]=−0.5,
[10, 5]=−0.5,
[11, 0]=−0.5,
[11, 3]=−0.5,
[12, 12]=1.0,

[12, 1]=−0.5,
[12, 4]=−0.5,
[13, 13]=1.5,
[13, 2]=−0.5,
[13, 3]=−0.5,
[13, 5]=−0.5,
[14, 14]=1.0,
[14, 5]=−0.5,
[14, 6]=−0.5.

The values of the elements [i, j] (i=0, 1, 2, ..., 14; j=15, 16, 17, 18) of the matrix $B_{12}$ with 15 rows and 4 columns are as follows. The values of the other elements of the matrix $B_{12}$ are all 0.
[0, 15]=0.5,
[3, 18]=0.5,
[4, 16]=0.5,
[4, 18]=0.5,
[5, 17]=0.5,
[6, 18]=0.5,
[7, 16]=0.5,
[7, 18]=0.5

Then, if the created simultaneous linear equations are solved, the following coordinates of these nodes are obtained.
Node 0: (7.9, 14.39),
Node 1: (10.4, 16.0),
Node 2: (12.9, 11.9),
Node 3: (13.1, 14.0),
Node 4: (12.9, 17.6),
Node 5: (15.2, 9.7),
Node 6: (15.1, 13.9),
Node 7: (13.5, 18.0),
Node 8: (0.0, 0.0),
Node 9: (9.2, 15.1),
Node 10: (12.0, 12.0),
Node 11: (10.5, 14.2),
Node 12: (11.7, 16.8),
Node 13: (13.7, 11.9),
Node 14: (15.1, 11.8).

Figure 14:
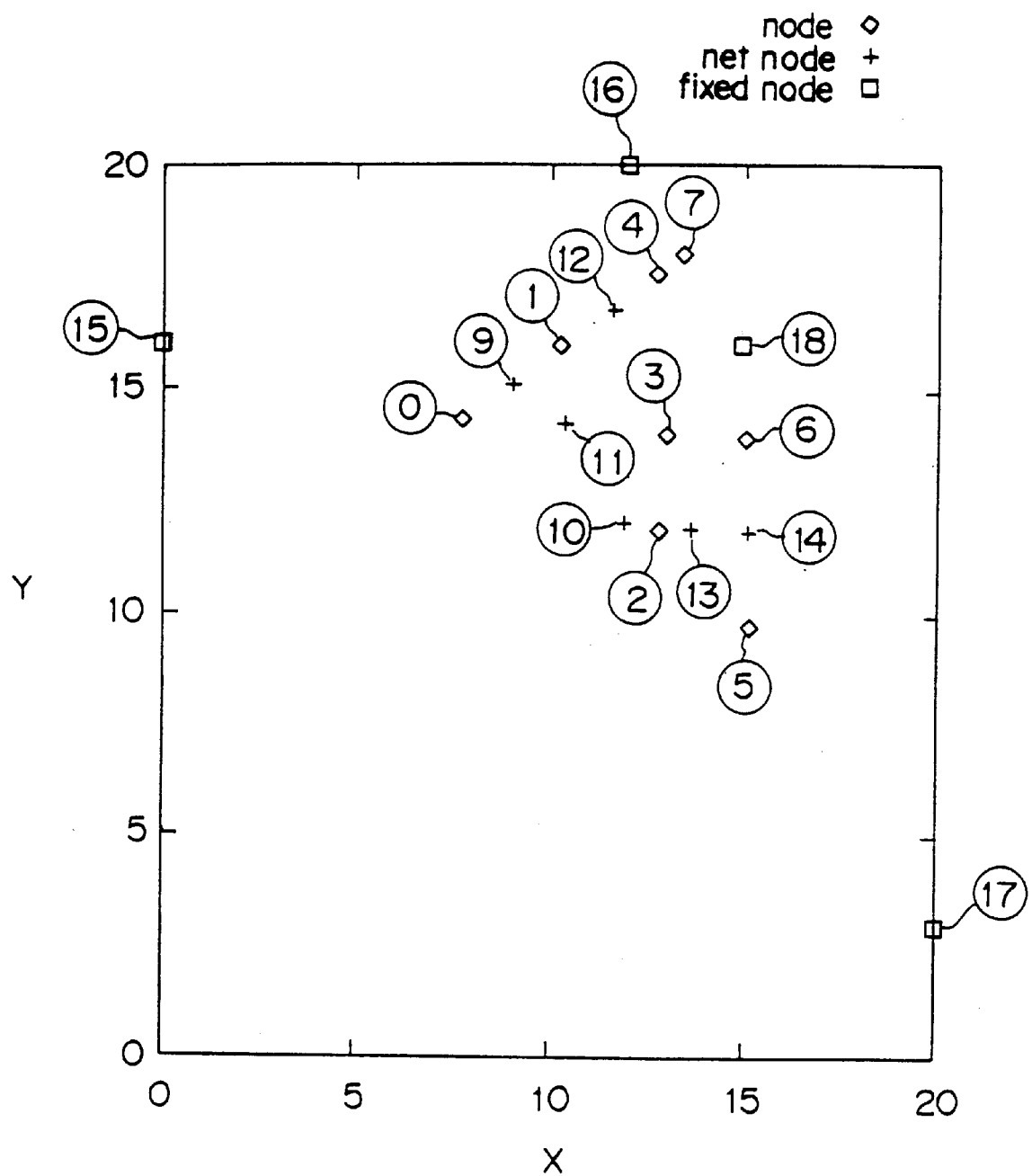
FIG. 14 shows the result of the second plotting.

When these node positions are plotted on an x-y coordinate plane, the result as shown in FIG. 14 can be obtained. In this case, since there is no need for the data of the node 8, the data is omitted. It is seen from FIG. 14 that the pair of nodes 4 and 7, and the pair of nodes 3 and 6, corresponding to target cells, are allocated closely each other, and the pairs are grouped. Accordingly, when the subsequent partitioning process is executed, the pairs can be allocated to the same block.

Figure 15:
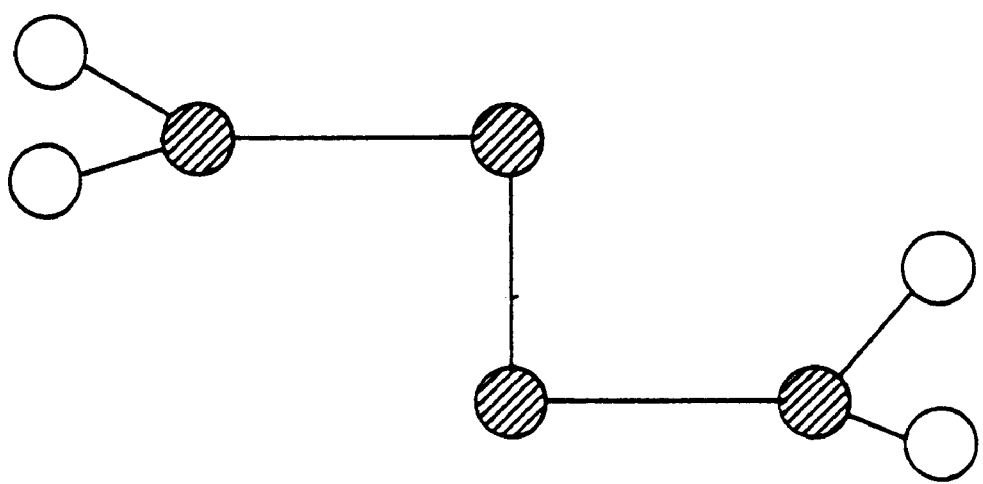
FIG. 15 shows the third net node model.

Next, the cell allocation in the case where a predetermined wiring pattern such as bus wiring is given, is described below. FIG. 15 shows a net node model including an existing wiring pattern such as this. In FIG. 15 several net nodes indicated by hatched lines are created, and a position coordinate is given to each of the net nodes. By using a net node model such as this, a partition/allocation process in consideration of an existing wiring pattern can be implemented.

Figure 16:
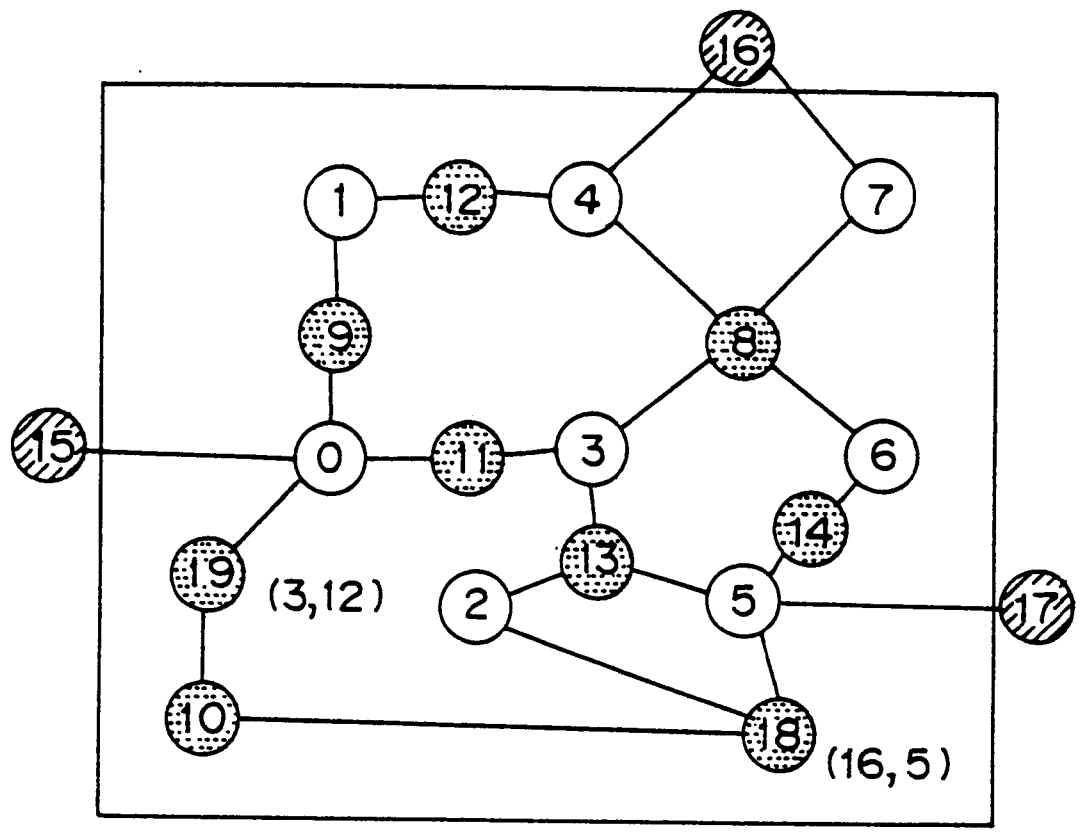
FIG. 16 shows the fourth net node model.

It is assumed that in the net node model shown in FIG. 8, a user sets a net node 10 for a net node of the existing wiring pattern as shown in FIG. 16. In this case, nodes 18 and 19 are created as net nodes for indicating the terminal points of the existing wiring pattern, and those positions (x, y) are designated as follows together with nodes 15 through 17.
Node 15: (0.0, 16.0),
Node 16: (12.0, 20.0),
Node 17: (20.0, 3.0),
Node 18: (16,5),
Node 19: (3, 13).

In step S22, the simultaneous linear equations of the equation (5) in the case that a 15-dimensional vector with the x-coordinates of nodes 0 through 14 as the elements, and a 5-dimensional vector with the x-coordinates of nodes 15 through 19 as the elements, are assumed to be x1 and x2, respectively, are obtained.

In this case, if the connection coefficient $c_{ij}$ between the nodes is appropriately determined, the values of the elements [i, j](i, j=0, 1, 2, ..., 14) of the matrix $B_{11}$ with 15 rows and 15 columns are as follows. The values of the other elements of the matrix $B_{11}$ are all 0.
[0, 0]=2.0,
[0, 9]=−0.5,
[0, 11]=−0.5,
[1, 1]=1.0,
[1, 9]=−0.5,
[1, 12]=−0.5,
[2, 2]=1.0,
[2, 13]=−0.5,
[3, 3]=1.5,
[3, 8]=−0.5,
[3,11]=−0.5,
[3,13]=−0.5,
[4, 4]=1.5
[4, 8]=−0.5,
[4, 12]=−0.5,
[5, 5]=2.0,
[5, 13]=−0.5,
[5, 14]=−0.5,
[6, 6]=1.0,
[6, 8]=−0.5,
[6, 14]=−0.5,
[7, 7]=1.0,
[7, 8]=−0.5,
[8, 8]=2.0,
[8, 3]=−0.5,
[8, 4]=−0.5,
[8, 6]=−0.5,
[8, 7]=−0.5,
[9, 9]=1.0,
[9, 0]=−0.5,
[9, 1]=−0.5,
[10, 10]=1.0,
[11, 11]=1.0,
[11, 0]=−0.5,
[11, 3]=−0.5,
[12, 12]=1.0,
[12, 1]=−0.5,
[12, 4]=−0.5,
[13, 13]=1.5,
[13, 2]=−0.5,
[13, 3]=−0.5,
[13, 5]=−0.5,
[14, 14]=1.0,
[14, 5]=−0.5,
[14, 6]=−0.5.

The values of the elements [i, j] (i=0, 1, 2, ..., 14; j=15, 16, 17, 18 and 19) of the matrix $B_{12}$ with 15 rows and 5 columns are as follows. The values of the other elements of the matrix $B_{12}$ are all 0.
[0, 15]=0.5,
[0, 19]=0.5,
[2, 18]=0.5,
[4, 16]=0.5,
[5, 17]=0.5,
[5, 18]=0.5,
[7, 16]=0.5,

[10, 18]=0.5,
[10, 19]=0.5
Then, if the created simultaneous linear equations are solved, the following coordinates of these nodes are obtained.
Node 0: (4.1, 14.0),
Node 1: (7.7, 15.6),
Node 2: (15.1, 7.1),
Node 3: (11.3, 12.5),
Node 4: (11.1, 17.1),
Node 5: (16.3, 8.2),
Node 6: (13.4, 12.7),
Node 7: (12.0, 17.5),
Node 8: (12.0, 14.9),
Node 9: (5.9, 14.8),
Node 10: (9.5, 8.5),
Node 11: (7.7, 13.3),
Node 12: (9.4, 16.3),
Node 13: (14.3, 9.3),
Node 14: (14.3, 10.4).

Figure 17:
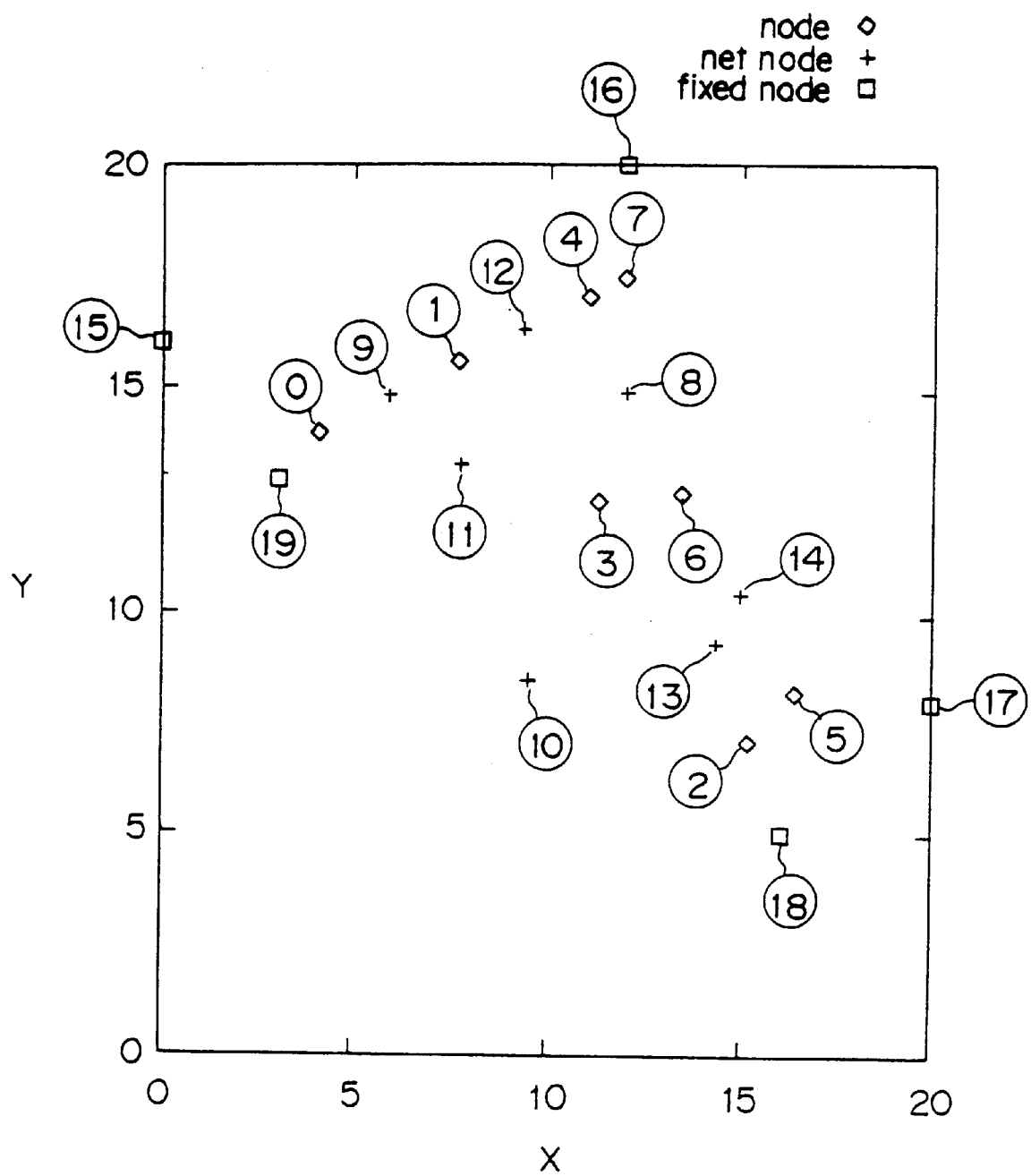
FIG. 17 shows the result of the third plotting.

If the positions of these nodes are plotted on an x-y coordinate plane, the result shown in FIG. 17 is obtained. In FIG. 17, the net node 10 is allocated between nodes 18 and 19. In this example, although the nodes 18 and 19 are fixed in the positions of the terminal points of the existing wiring pattern, the same processes can also be executed even if these nodes are fixed in another arbitrary position on the existing wiring pattern.

Next, the case where a net node model is applied to a floor planning, is described below. In a floor planning, for example, the blocks to be divided of the allocation area are given in advance as a floor plan, and cells are allocated taking into consideration the shape, area and position of external terminals, etc. of the chip. In this case, the position through which a net passes on the boundary of the blocks is calculated for the position of the external terminals of the blocks.

In this case, when all cells connected to a certain net belong to the same block, the partitioning process is executed with the position coordinate of a corresponding net node set at the center of the block. Then, the position through which a net connecting the inside and the outside of the block passes on the boundary of the blocks shall be the position of the external terminal of the block.

Figure 18:
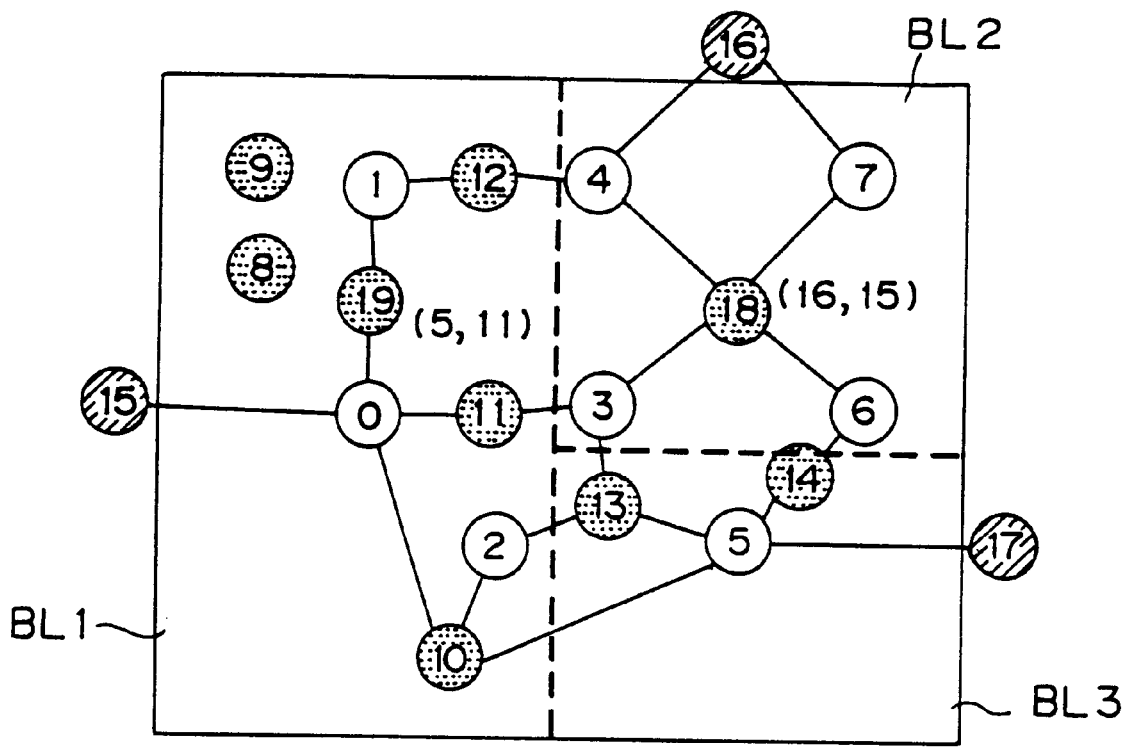
FIG. 18 shows the fifth net node model.

For example, it is assumed that in the net node model shown in FIG. 8, a floor plan as shown in FIG. 18 is given. In FIG. 18 broken lines indicate the boundary lines of the blocks in the floor plan. In this case, cell nodes 3, 4, 6 and 7 connected to a net node 8, and cell nodes 0 and 1 connected to a net node 9 shall be allocated to a block BL2 on the upper right and a block BL1 on the left, respectively.

In this case, the net nodes 8 and 9 are fixed in a position (16,15) near the center of the block BL2 and a position (5, 11) near the center of the block BL1, respectively. Then, the numbers of nodes 8 and 9 are replaced with 18 and 19, respectively, for consideration of convenience in preparing a matrix, and a net node model as shown in FIG. 18 is created.

Accordingly, the positions (x, y) of nodes 15 through 19 are set as follows:
Node 15: (0, 16),
Node 16: (12, 20),
Node 17: (20, 8),
Node 18: (16, 15),
Node 19: (5, 11).

In step S22, the simultaneous linear equations of the equation (5) in the case that a 15-dimensional vector with the x-coordinates of nodes 0 through 14 as the elements, and a 5-dimensional vector with the x-coordinates of nodes 15 through 19 as the elements, are assumed to be x1 and x2, respectively, are obtained.

In this case, if the connection coefficient $c_{ij}$ between the nodes is appropriately determined, the values of the elements [i, j] (i, j=0, 1, 2, . . . , 14) of the matrix $B_{11}$ with 15 rows and 15 columns are as follows. The values of the other elements of the matrix $B_{11}$ are all 0.
[0, 0]=2.0,
[0, 10]=−0.5,
[0, 11]=−0.5,
[1, 1]=1.0,
[1, 12]=−0.5,
[2, 2]=1.0,
[2, 10]=−0.5,
[2, 13]=−0.5,
[3, 3]=1.5,
[3, 11]=−0.5,
[3, 13]=−0.5,
[4, 4]=1.5,
[4, 12]=−0.5,
[5, 5]=2.0,
[5, 10]=−0.5,
[5, 13]=−0.5,
[5, 14]=−0.5,
[6, 6]=1.0,
[6, 14]=−0.5,
[7, 7]=1.0,
[8, 8]=0.0,
[9, 9]=0.0,
[10, 10]=1.5,
[10, 0]=−0.5,
[10, 2]=−0.5,
[10, 5]=−0.5,
[11, 11]=1.0,
[11, 0]=−0.5,
[11, 3]=−0.5,
[12, 12]=1.0,
[12, 1]=−0.5,
[12, 4]=−0.5,
[13, 13]=1.5,
[13, 2]=−0.5,
[13, 3]=−0.5,
[13, 5]=−0.5,
[14, 14]=1.0,
[14, 5]=−0.5,
[14, 6]=−0.5.

The values of the elements [i, j] (i=0, 1, 2, . . . , 14; j=15, 16, 17, 18 and 19) of the matrix $B_{12}$ with 15 rows and 5 columns are as follows. The values of the other elements of the matrix $B_{12}$ are all 0.
[0, 15]=0.5,
[0, 19]=0.5,
[1, 19]=0.5,
[3, 18]=0.5,
[4, 16]=0.5,
[4, 18]=0.5,
[5, 17]=0.5,
[6, 18]=0.5,
[7, 16]=0.5
[7, 18]=0.5.

Then, if the created simultaneous linear equations are solved, the following coordinates of these nodes are obtained.
Node 0: (6.5, 13.1),
Node 1: (7.6, 12.9), Node 2: (12.5, 12.3),
Node 3: (13.1, 13.6),
Node 4: (12.7, 16.6),
Node 5: (15.1, 11.3),
Node 6: (15.7, 13.8),
Node 7: (14.0, 17.5),
Node 10: (11.3, 12.2),
Node 11: (9.8, 13.4),
Node 12: (10.1, 14.7),
Node 13: (13.5, 12.4),
Node 14: (15.4, 12.5).

Figure 19:
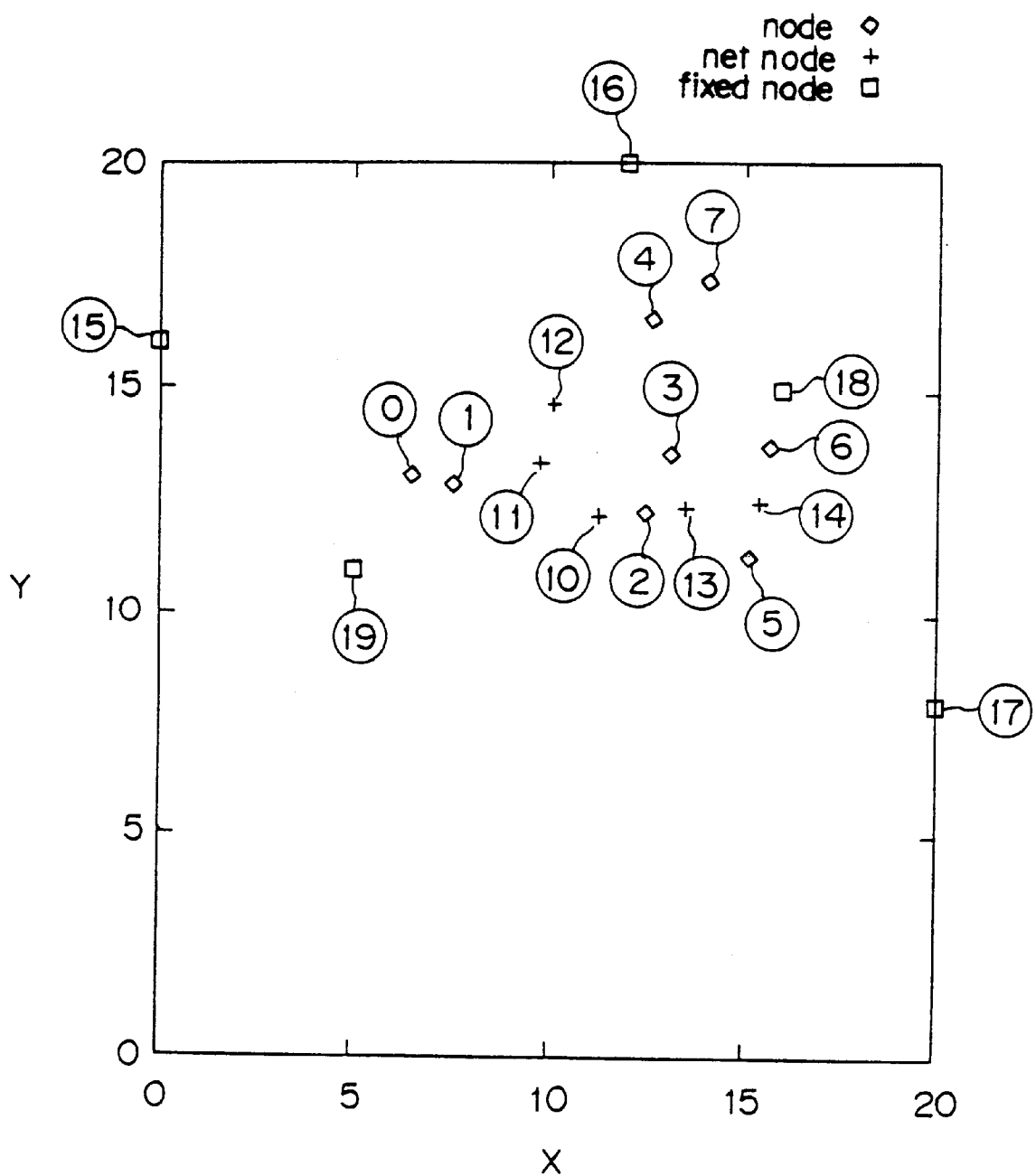
FIG. 19 shows the result of the fourth plotting.

If the positions of these nodes are plotted on an x-y coordinate plane, the result shown in FIG. 19 is obtained. In this case, since the data of nodes 8 and 9 are unnecessary, these data are omitted. In FIG. 19 net nodes 11 and 12 are allocated around the cut line between blocks BL1 and BL2, and from these positions the terminal position on the cut line can be set. In the same way, from the positions of net nodes 13 and 14, the terminal position on the cut line between blocks BL2 and BL3 can be set.

For example, these net node positions can be set for the terminal positions as they are, or the position where an edge extending from the net node crosses the cut line can be set for the terminal position. The net nodes 18 and 19 are not necessarily fixed at the center of each block, and can also be fixed in an appropriate position in each block.

As described above, by using a resistive network based on a net node model, FFs can be grouped, a partitioning in consideration of an existing wiring pattern can be implemented, and the positions of external terminals in a floor plan can be determined.

Furthermore, by executing a partitioning process while net nodes of nets for both FFs and existing wiring pattern are fixed, an FF group partitioning in consideration of the existing wiring pattern can be implemented. By executing a partitioning process while both the net nodes of nets connected to a plurality of cells to be allocated to a certain block and the net nodes of nets for an existing wiring pattern are fixed, the positions of the external terminals of a block can be calculated while the existing wiring pattern is taken into consideration.

Although in the above-mentioned embodiment the simultaneous linear equations of a resistive network are solved using the SOR method, it is not necessarily limited to this method, and another arbitrary method can also be used.

In the present invention, when determining the default allocation of cells in the automatic layout of semiconductor integrated circuits, etc. not only a cell but also a net between cells is regarded as one node, and thereby a resistive network method is applied. Accordingly, cell allocation closer to an actual wiring pattern can be obtained, and thereby the desirable result of partitioning can be obtained. By devising a method of partitioning cells located around the boundary of blocks, the number of cuts can also be optimized.

What is claimed is:

1. An allocation apparatus for determining a cell allocation in a circuit, comprising:
    creating means for creating cell nodes corresponding to a plurality of cells and a net node corresponding to a net among cells from a net list of said circuit;
    storing means for storing a parameter for simultaneous equations relating to positions of said cell nodes and net node;
    calculating means for obtaining a solution of said simultaneous equations using said parameter; and
    outputting means for outputting the solution of said simultaneous equations.

2. The allocation apparatus according to claim 1, wherein
    said creating means connects adjacent cell nodes and the net node and creates a network model,
    said storing means stores the parameter for said simultaneous equations for describing a resistive network based on the network model, and
    said calculating means solves the simultaneous equations and optimizes the positions of said cell nodes and net node.

3. The allocation apparatus according to claim 1, further comprising
    partitioning means for partitioning said plurality of cells using the solution of said simultaneous equations,
    wherein said outputting means outputs a result of the partitioning.

4. The allocation apparatus according to claim 3, wherein
    said partitioning means determines a block to which one or more cell nodes connected to one net node are allocated, based on the position of the net node contained in the solution of said simultaneous equations.

5. The allocation apparatus according to claim 4, wherein
    said partitioning means sorts a plurality of net nodes according to the coordinate values of the position and allocates one or more cell nodes connected to each net node to the same block in sorting order.

6. The allocation apparatus according to claim 1, further comprising
    designating means for designating a specific position in said circuit as the position of the net node, wherein
    said storing means stores the parameter for said simultaneous equations based on the specific position.

7. The allocation apparatus according to claim 6, wherein
    said designating means designates a position of a terminal for supplying a target cell in said circuit with a clock signal, as said specific position, and
    said calculating means calculates positions of one or more cell nodes connected to the net node in the specific position and groups target cells corresponding to the one or more cell nodes.

8. The allocation apparatus according to claim 6, wherein
    said designating means designates a position on a given wiring pattern in said circuit as said specific position, and
    said calculating means calculates positions of one or more cell nodes connected to the net node in the specific position and implements the cell allocation in consideration of said wiring pattern.

9. The allocation apparatus according to claim 6, wherein
    said designating means designates a position inside a specific block in said circuit as said specific position,
    said calculating means calculates a position of a net node around a boundary of the specific block and determines a position of an external terminal of the specific block from the position of the net node around the boundary, and
    said outputting means outputs the position of the external terminal.

10. The allocation apparatus according to claim 9, wherein
    said calculating means designates a position on said boundary through which a net connecting said specific block and the outside passes, as the position of said external terminal.

11. The allocation apparatus according to claim 1, further comprising first designating means for designating a position of a terminal for supplying a target cell in said circuit with a clock signal as a position of a net node; and second designating means for designating a position on a given wiring pattern in said circuit as a position of a net node, wherein said storing means stores the parameter for said simultaneous equations based on the designated positions, and said calculating means calculates positions of one or more cell nodes connected to the net nodes in the designated positions and groups target cells in consideration of said wiring pattern.

12. The allocation apparatus according to claim 1, further comprising first designating means for designating a position of a specific block in said circuit as a position of a net node; and second designating means for designating a position on a given wiring pattern in said circuit as a position of a net node wherein said storing means stores the parameter for said simultaneous equations based on the designated positions, said calculating means calculates a position of a net node around a boundary of the specific block and determines a position of an external terminal of the specific block in consideration of said wiring pattern, and said outputting means outputs the position of the external terminal.

13. A computer-readable storage medium storing a program for a computer which determines a cell allocation of a circuit, said program enabling said computer to execute the steps of:

creating cell nodes corresponding to a plurality of cells and a net node corresponding to a net between the cells from a net list of said circuit;

storing a parameter for simultaneous equations relating to positions of said cell nodes and net node;

obtaining a solution of said simultaneous equations using said parameter; and outputting the solution of said simultaneous equations.

14. The storage medium according to claim 13, said program further enabling said computer to execute the steps of:

connecting adjacent cell nodes and the net node and creating a network model; and solving said simultaneous equations and optimizing positions of said cell nodes and net node.

15. The storage medium according to claim 14, said program further enabling said computer to execute the steps of:

partitioning said plurality of cells using the solution of said simultaneous equations; and outputting a result of the partitioning.

16. An allocation method of determining a cell allocation of a circuit, comprising the steps of:

creating cell nodes corresponding to a plurality of cells and a net node corresponding to a net between the cells from a net list of said circuit;

creating simultaneous equations relating to positions of said cell nodes and net node; and obtaining a solution of said simultaneous equations.

* * * * *